(12) United States Patent
Mleczko et al.

(10) Patent No.: US 11,539,866 B2
(45) Date of Patent: *Dec. 27, 2022

(54) VEHICULAR CAMERA WITH ENHANCED HEAT DISSIPATION

(71) Applicant: Magna Electronics Inc., Auburn Hills, MI (US)

(72) Inventors: Jamie A. Mleczko, Washington, MI (US); Steven V. Byrne, Goodrich, MI (US); Jonathan D. Conger, Berkley, MI (US); Rene Dreiocker, Rochester Hills, MI (US); Rainer Strey, Solms (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/648,004

(22) Filed: Jan. 14, 2022

(65) Prior Publication Data

US 2022/0141366 A1 May 5, 2022

Related U.S. Application Data

(63) Continuation of application No. 17/247,081, filed on Nov. 30, 2020, now Pat. No. 11,228,697, which is a
(Continued)

(51) Int. Cl.
*H04N 5/225* (2006.01)
*B60R 1/00* (2022.01)
(Continued)

(52) U.S. Cl.
CPC .......... *H04N 5/22521* (2018.08); *B60R 1/00* (2013.01); *B60R 11/04* (2013.01); *F25B 21/02* (2013.01);
(Continued)

(58) Field of Classification Search
CPC ............. H04N 5/22521; H04N 5/2252; H04N 5/2253; B60R 1/00; B60R 11/04;
(Continued)

(56) References Cited

U.S. PATENT DOCUMENTS

| 4,712,879 A | 12/1987 | Lynam et al. |
| 5,393,931 A | 2/1995 | Guenther |

(Continued)

*Primary Examiner* — Jason A Flohre
(74) *Attorney, Agent, or Firm* — Honigman LLP

(57) ABSTRACT

A vehicular camera module includes a camera housing, an imager printed circuit board and a processor printed circuit board. An imager is disposed at a first side of the imager printed circuit board. A heat transfer element is accommodated in the camera housing and is in thermal conductive contact with an active cooling element and with a second side of the imager printed circuit board or the processor printed circuit board. Circuitry of the camera module is electrically connected to electrical connecting elements that electrically connect to a wire harness of a vehicle when the vehicular camera module is disposed at the vehicle. With the electrical connecting elements electrically connected to the wire harness of the vehicle, heat generated by operation of the vehicular camera module is drawn from the imager printed circuit board to the camera housing via the heat transfer element.

16 Claims, 2 Drawing Sheets

Related U.S. Application Data continuation of application No. 16/165,204, filed on Oct. 19, 2018, now Pat. No. 10,855,890.

(60) Provisional application No. 62/575,651, filed on Oct. 23, 2017.

(51) Int. Cl.
*H05K 7/20* (2006.01)
*F25B 21/02* (2006.01)
*B60R 11/04* (2006.01)

(52) U.S. Cl.
CPC ......... *H04N 5/2252* (2013.01); *H04N 5/2253* (2013.01); *H05K 7/205* (2013.01); *H05K 7/20409* (2013.01); *H05K 7/20854* (2013.01); *B60R 2300/105* (2013.01); *B60R 2300/30* (2013.01); *F25B 2321/023* (2013.01); *F25B 2321/0251* (2013.01)

(58) Field of Classification Search
CPC ........... B60R 2300/105; B60R 2300/30; F25B 21/02; F25B 2321/023; F25B 2321/0251; H05K 7/20409; H05K 7/205; H05K 7/20854
See application file for complete search history.

(56) References Cited

U.S. PATENT DOCUMENTS

| | | |
|---|---|---|
| 5,550,677 A | 8/1996 | Schofield et al. |
| 5,670,935 A | 9/1997 | Schofield et al. |
| 5,949,331 A | 9/1999 | Schofield et al. |
| 5,978,017 A | 11/1999 | Tino |
| 6,151,065 A | 11/2000 | Steed et al. |
| 6,690,268 B2 | 2/2004 | Schofield et al. |
| 6,824,281 B2 | 11/2004 | Schofield et al. |
| 7,038,577 B2 | 5/2006 | Pawlicki et al. |
| 7,479,986 B2 | 1/2009 | Karaki |
| 7,480,149 B2 | 1/2009 | DeWard et al. |
| 7,720,580 B2 | 5/2010 | Higgins-Luthman |
| 7,855,755 B2 | 12/2010 | Weller et al. |
| 7,965,336 B2 | 6/2011 | Bingle et al. |
| 8,256,821 B2 | 9/2012 | Lawlor et al. |
| 8,542,451 B2 | 9/2013 | Lu et al. |
| 8,994,878 B2 | 3/2015 | Byrne et al. |
| 9,077,098 B2 | 7/2015 | Latunski |
| 9,233,641 B2 | 1/2016 | Sesti et al. |
| 9,277,104 B2 | 3/2016 | Sesti et al. |
| 9,596,387 B2 | 3/2017 | Achenbach et al. |
| 9,621,769 B2 | 4/2017 | Mai et al. |
| 10,207,646 B2 | 2/2019 | Oh |
| 10,274,812 B1 | 4/2019 | Chen |
| 10,855,890 B2 | 12/2020 | Mleczko et al. |
| 11,228,697 B2 | 1/2022 | Mleczko et al. |
| 2003/0090569 A1 | 5/2003 | Poechmueller |
| 2004/0075870 A1* | 4/2004 | Karaki ................ H04N 5/349 358/296 |
| 2004/0169771 A1 | 9/2004 | Washington et al. |
| 2009/0244361 A1 | 10/2009 | Gebauer et al. |
| 2009/0295181 A1 | 12/2009 | Lawlor et al. |
| 2011/0025850 A1 | 2/2011 | Maekawa et al. |
| 2011/0298925 A1 | 12/2011 | Inoue et al. |
| 2013/0242099 A1 | 9/2013 | Sauer et al. |
| 2014/0104184 A1 | 4/2014 | Meador et al. |
| 2014/0160284 A1 | 6/2014 | Achenbach et al. |
| 2014/0226012 A1 | 8/2014 | Achenbach |
| 2014/0373345 A1 | 12/2014 | Steigerwald |
| 2015/0015713 A1 | 1/2015 | Wang et al. |
| 2015/0029337 A1 | 1/2015 | Uchiyama et al. |
| 2015/0054961 A1 | 2/2015 | Saitoh et al. |
| 2015/0070557 A1 | 3/2015 | Petty et al. |
| 2015/0124098 A1 | 5/2015 | Winden et al. |
| 2015/0205186 A1 | 7/2015 | Park et al. |
| 2015/0222795 A1 | 8/2015 | Sauer et al. |
| 2015/0266430 A1 | 9/2015 | Mleczko et al. |
| 2015/0327398 A1 | 11/2015 | Achenbach et al. |
| 2015/0365569 A1 | 12/2015 | Mai et al. |
| 2016/0037028 A1 | 2/2016 | Biemer |
| 2016/0191863 A1 | 6/2016 | Minikey, Jr. et al. |
| 2016/0243987 A1 | 8/2016 | Kendall |
| 2016/0268716 A1 | 9/2016 | Conger et al. |
| 2016/0286103 A1 | 9/2016 | Van Dan Elzen |
| 2017/0036600 A1 | 2/2017 | Whitehead et al. |
| 2017/0054881 A1 | 2/2017 | Conger et al. |
| 2017/0133811 A1 | 5/2017 | Conger et al. |
| 2017/0201661 A1 | 7/2017 | Conger |
| 2017/0280034 A1 | 9/2017 | Hess et al. |
| 2017/0295306 A1 | 10/2017 | Mleczko |
| 2017/0302829 A1 | 10/2017 | Mleczko et al. |
| 2018/0027151 A1 | 1/2018 | Kazama et al. |
| 2018/0072239 A1 | 3/2018 | Wienecke et al. |
| 2018/0098033 A1 | 4/2018 | Mleczko et al. |
| 2018/0241917 A1 | 8/2018 | Zhang et al. |
| 2018/0345911 A1* | 12/2018 | Zurowski ............... G03B 17/55 |
| 2019/0121051 A1 | 4/2019 | Byrne et al. |
| 2019/0124238 A1 | 4/2019 | Byrne et al. |
| 2019/0124243 A1 | 4/2019 | Mleczko et al. |
| 2019/0306966 A1 | 10/2019 | Byrne et al. |
| 2020/0001787 A1 | 1/2020 | Lu et al. |
| 2020/0010024 A1 | 1/2020 | Sesti et al. |

\* cited by examiner

VEHICULAR CAMERA WITH ENHANCED HEAT DISSIPATION

CROSS REFERENCE TO RELATED APPLICATIONS

The present application is a continuation of U.S. patent application Ser. No. 17/247,081, filed Nov. 30, 2020, now U.S. Pat. No. 11,228,697, which is a continuation of U.S. patent application Ser. No. 16/165,204, filed Oct. 19, 2018, now U.S. Pat. No. 10,855,890, which claims the filing benefits of U.S. provisional application Ser. No. 62/575,651, filed Oct. 23, 2017, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. Various cameras have been proposed for such imaging systems, including cameras of the types described in U.S. Pat. No. 7,965,336 and U.S. Publication No. US-2009-0244361, which are hereby incorporated herein by reference in their entireties.

SUMMARY OF THE INVENTION

The present invention provides a vision system or imaging system for a vehicle that utilizes one or more cameras to capture image data representative of images exterior of the vehicle. The camera or camera module comprises an imager and a circuit board (or circuit boards) and a lens at a lens barrel. A front camera housing portion is configured to receive an imager printed circuit board therein, with the imager printed circuit board disposed at the lens barrel with the imager optically aligned with an optical axis of optical elements of the lens. A rear camera housing portion is mated with a rear portion of the front camera housing so as to encase and seal the imager printed circuit board in the camera module. A thermoelectric device is disposed at the rear camera housing portion, and a heat transfer element is disposed between and in thermal conductive contact with the thermoelectric device and the imager printed circuit board. The thermoelectric device is electrically powered to draw heat from the imager printed circuit board to the rear camera housing portion. The thermoelectric device may be operable responsive to a temperature sensor disposed in the camera module. Circuitry of the camera module is electrically connected to the imager and the thermoelectric device and is electrically connected to electrical connecting elements that are configured to electrically connect to a wire harness of the vehicle.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
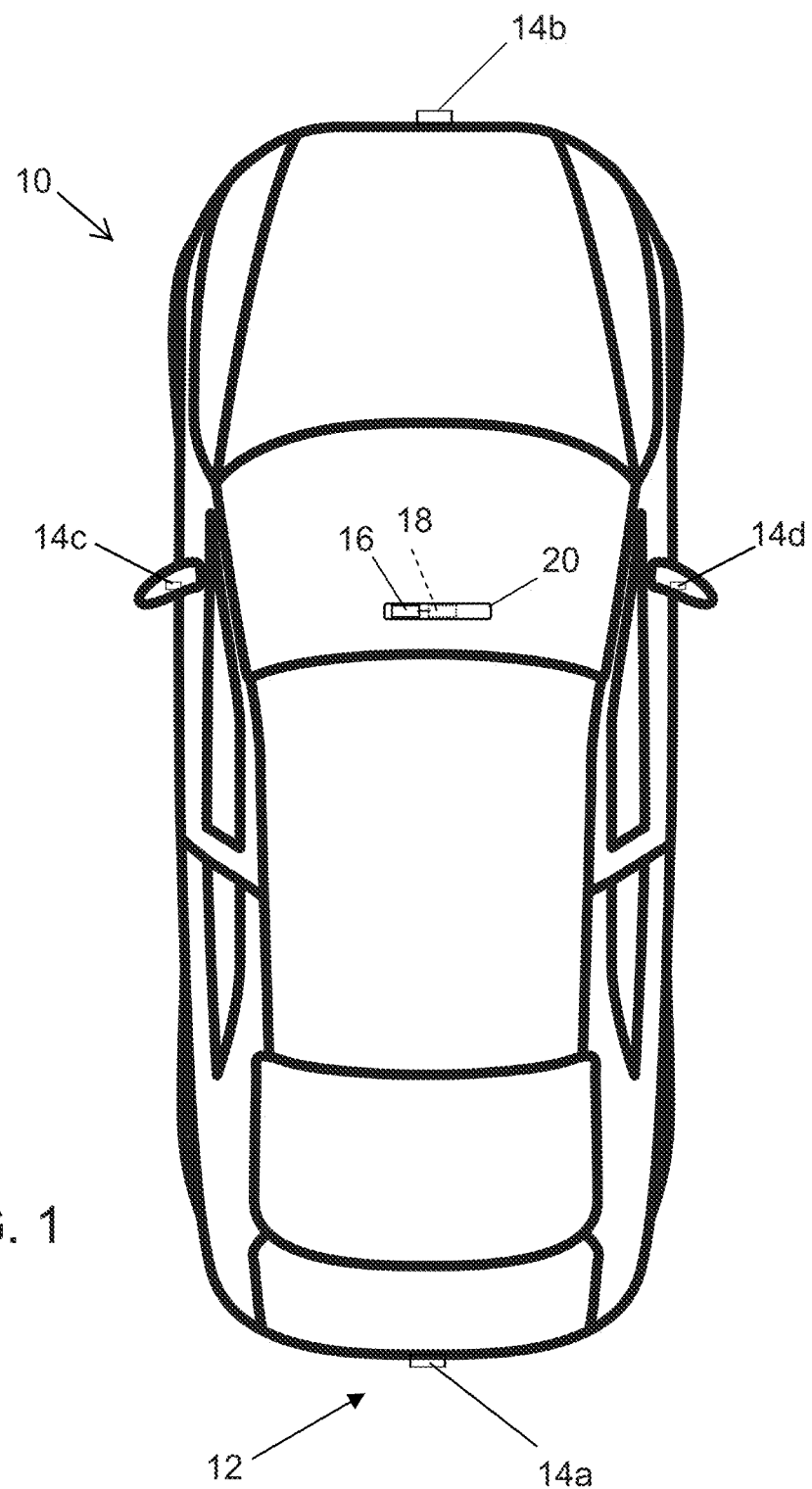
FIG. 1 is a plan view of a vehicle with a vision system that incorporates cameras in accordance with the present invention.

Referring now to the drawings and the illustrative embodiments depicted therein, a vehicle 10 includes an imaging system or vision system 12 that includes at least one exterior facing imaging sensor or camera, such as a rearward facing imaging sensor or camera 14a (and the system may optionally include multiple exterior facing imaging sensors or cameras, such as a forward facing camera 14b at the front (or at the windshield) of the vehicle, and a sideward/rearward facing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) or processor 18 that is operable to process image data captured by the camera or cameras and may detect objects or the like and/or provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

The control unit may comprise or may be part of an autonomous vehicle control system, whereby the cameras capture image data that is processed for use in autonomously controlling the vehicle. Such high resolution autonomous vehicle cameras require exceptional image quality for machine vision. Image quality degradation occurs from sensor noise at elevated temperatures. Automotive industry sensor suppliers see this occurring to some degree at temperatures as low as 45 degrees C.

High-resolution and automotive cameras take steps to optimize heat transfer between the image sensor or imager and external heat dissipating features. Many such cameras are expected to operate in ambient temperatures as high as around 85 degrees C. so can rarely achieve sensor junction temperatures below around 100 degrees C. Image degradation at these temperatures may be substantial and limits machine vision capabilities.

Figure 2:
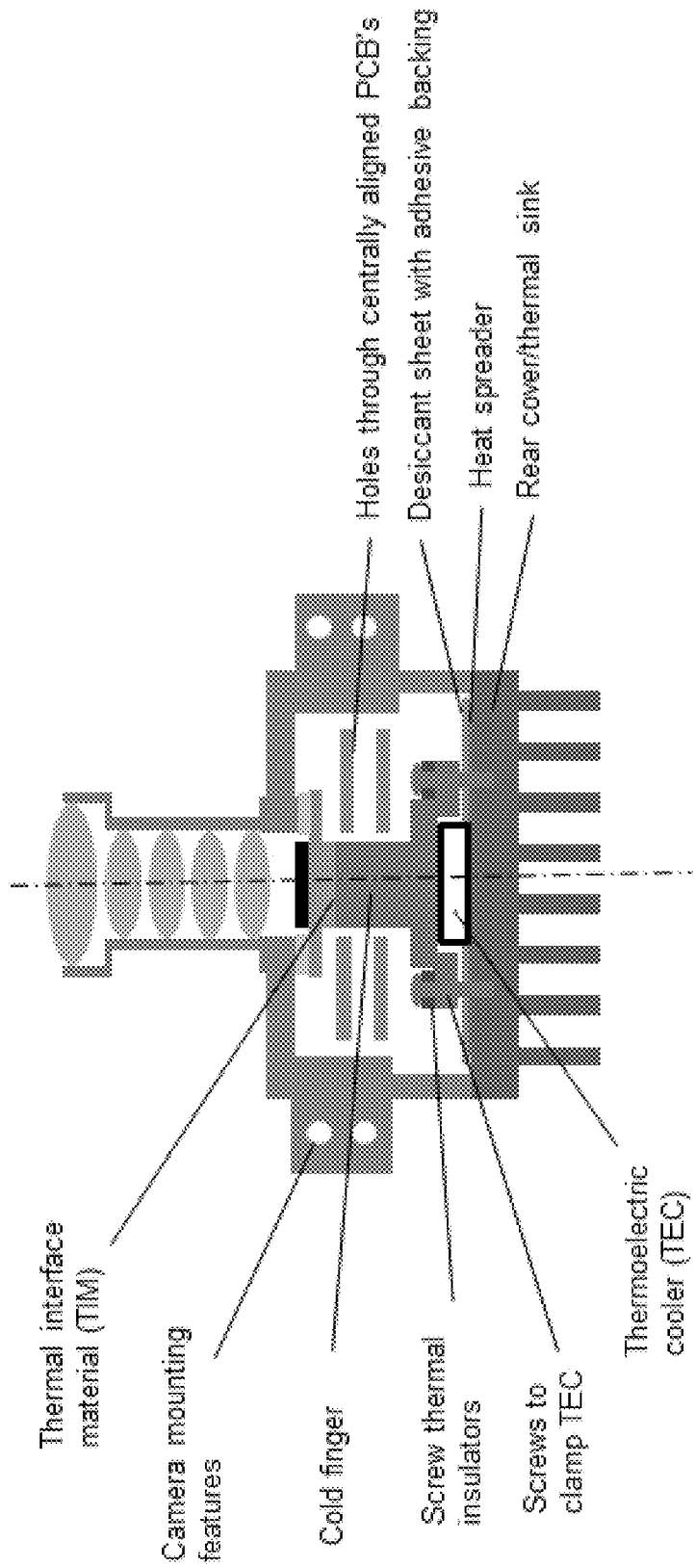
FIG. 2 is a sectional view of a camera module in accordance with the present invention.

The autonomous vehicle camera of the present invention includes active cooling. As shown in FIG. 2, a thermoelectric cooler (TEC), or Peltier element, is used to substantially cool the image sensor to a desired temperature. The camera thus comprises the first automotive camera with an actively cooled image sensor. The camera includes temperature sensors within the camera that are used to control power to the TEC as needed for cooling effect. For example, responsive to the sensed temperature being above a threshold level, power to the TEC may be provided or increased or modulated or controlled to provide more cooling. The system may continuously or episodically sense or monitor the camera temperature and may continuously or episodically adjust the power supplied to the TEC to provide the desired cooling effect. The sensor and control for sensing temperature and controlling or powering the TEC may be part of the camera module itself, such as part of the circuitry disposed on one or more circuit boards in the camera module.

As also shown in FIG. 2, the rear cover of the camera will be used as a "heat sink" and can have cooling fins or pins. The TEC is disposed or captured between the rear cover or rear housing portion and a copper or aluminum "cold finger" or element that directs or transfers the heat from the image sensor to the TEC. Optionally, for space efficiency, a centralized heat removal system (the cold finger in FIG. 2) may extend through holes in additional PCBs to provide the heat transfer path centrally from the image sensor to the TEC at the rear housing portion.

Thus, and such as shown in FIG. 2, the camera module of the present invention includes a lens barrel and camera upper or front housing portion, with the imager disposed at or near the lens barrel and focused and aligned with the optical elements of the lens barrel. The rear housing portion includes an electrically powered thermoelectric cooler that is in contact with a heat transfer element or cold finger that extends from the TEC to the imager circuit board. Optionally, a thermal interface material may be disposed between the imager circuit board and the heat transfer element to enhance heat transfer from the rear of the imager circuit board to the heat transfer element. The thermal interface material may comprise any suitable thermally conductive material, such as, for example, thermally conductive paste, epoxy, film or tape or the like, which establishes a thermally conductive connection between the end of the heat transfer element and the printed circuit board.

The heat transfer element is formed to be disposed over and at least partially around the TEC and is attached to the rear housing portion via fasteners or screws, which may be tightened to clamp the heat transfer element to and around the TEC to provide and maintain contact between the heat transfer element and the TEC. Thermal insulators may be provided at the screws. Optionally, for example, a desiccant sheet with adhesive backing may be disposed between the heat transfer element and the rear housing portion. Optionally, a heat spreader, such as one made from graphite (such as a graphite sheet or layer or film, or such as another suitable heat spreading or heat diffusing sheet or layer or film, such as, for example, a graphene sheet or layer or film or the like), may be disposed between the heat transfer element and the rear housing portion to enhance the rear cover sink ability.

In the illustrated embodiment, the camera module includes two printed circuit boards (in addition to the imager PCB) that include circuitry associated with the imager and camera. The heat transfer element protrudes generally centrally aligned holes or apertures in the two PCBs and terminates at the rear of the imager PCB, such that the heat transfer element thermally conductively connects at the rear of the imager PCB to draw or conduct or transfer heat generated by the imager (during operation of the camera) away from the imager PCB to the TEC and rear cover or housing portion. Optionally, the heat transfer element may contact one or both of the other PCBs to draw heat from them as well. Optionally, the heat transfer element may engage a rear side of another circuit board (and not engage the imager PCB) to draw heat from circuitry or components that are disposed on the other circuit board (such that heat generated by an image processor of the other circuit board is drawn away from the image processor and toward the rear of the camera). Circuitry of the PCBs and of the camera module (including the image processor and TEC or circuitry associated with the TEC) is electrically connected to the imager and is electrically connected to electrical connecting elements that are configured to electrically connect to a wire harness of the vehicle when the camera module is disposed at the vehicle.

As shown in FIG. 2, the heat transfer element is in thermal conductive contact with the TEC and with the rear housing or cover and the heat sink, and extends therefrom into the cavity of the camera module. The end of the heat transfer element that is distal from the TEC and the rear housing is in thermal contact with the imager PCB (at the rear or opposite side of the imager PCB from where the imager is disposed). The heat transfer element protrudes through an aperture or hole through one or more other PCBs, which are centrally aligned with the axis of the camera module and lens assembly. The desiccant sheet and/or heat spreader may be disposed at the interior surface of the rear housing portion and between the rear housing portion and the heat transfer element (which may be fastened to the rear housing portion via fasteners or the like) to spread the heat conducted by the heat transfer element (drawn from the PCB(s) via operation of the TEC) over the rear housing portion and heat sink to enhance cooling of the camera module during operation.

Also, the image sensor PCB is directly adhesively bonded at the front camera housing or lens or lens barrel. To eliminate all sources of movement between the lens and image sensor, the imager or its printed circuit board is bonded directly to the lens structure or lens barrel, such as via a suitable quick-cure adhesive (see FIG. 2). The bonding adhesive also acts as the pliable assembly element or member between the optics and the imager or imaging sensor for the focus and alignment steps (and then cures to a cured state that retains the imager PCB and imager relative to the lens barrel and lens). For example, the adhesive and focus and alignment steps may utilize aspects of the cameras and processes described in U.S. Pat. Nos. 8,542,451 and 9,277,104, which are hereby incorporated herein by reference in their entireties.

The camera module may utilize aspects of the cameras and connectors described in U.S. Pat. Nos. 9,621,769; 9,596,387; 9,277,104; 9,077,098; 8,994,878; 8,542,451 and/or 7,965,336, and/or U.S. Publication Nos. US-2009-0244361; US-2013-0242099; US-2014-0373345; US-2015-0124098; US-2015-0222795; US-2015-0327398; US-2016-0243987; US-2016-0268716; US-2016-0286103; US-2016-0037028; US-2017-0054881; US-2017-0133811; US-2017-0201661; US-2017-0280034; US-2017-0295306; US-2017-0302829 and/or US-2018-0098033, and/or U.S. patent applications, Ser. No. 16/165,170, filed Oct. 19, 2018, now U.S. Pat. No. 10,750,064, and/or Ser. No. 16/165,253, filed Oct. 19, 2018, now U.S. Pat. No. 10,678,018, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ™ family of image processing chips (for example, an EYEQ3™, EYEQ4™ or EYEQ5™ image processing chip) available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/081985, and/or U.S. Pat. No. 9,126,525, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular camera module, said vehicular camera module comprising:
    a camera housing;
    an imager printed circuit board accommodated in said camera housing, said imager printed circuit board having a first side and a second side separated by a thickness dimension of said imager printed circuit board;
    an imager disposed at the first side of said imager printed circuit board and aligned with a lens of said vehicular camera module;
    a processor printed circuit board accommodated in said camera housing;
    an image processor disposed at said processor printed circuit board;
    wherein said processor printed circuit board is spaced from and is electrically connected to circuitry of said imager printed circuit board;
    a heat transfer element accommodated in said camera housing;
    wherein the heat transfer element is in thermal conductive contact with at least one selected from the group consisting of (i) the second side of said imager printed circuit board and (ii) said processor printed circuit board;
    wherein said heat transfer element is in thermal conductive contact with an active cooling element;
    wherein circuitry of said vehicular camera module is electrically connected to said imager and said image processor and is electrically connected to electrical connecting elements at said camera housing that are configured to electrically connect to a wire harness of a vehicle when said vehicular camera module is disposed at the vehicle; and
    wherein, with said electrical connecting elements electrically connected to the wire harness of the vehicle, heat generated by operation of said vehicular camera module is drawn from said imager printed circuit board to said camera housing via said heat transfer element.

2. The vehicular camera module of claim 1, wherein said heat transfer element is in thermal conductive contact with the second side of said imager printed circuit board, and wherein said heat transfer element extends through an aperture of said processor printed circuit board.

3. The vehicular camera module of claim 2, comprising a thermal interface material disposed between and in thermal conductive contact with (i) the second side of said imager printed circuit board and (ii) said heat transfer element.

4. The vehicular camera module of claim 1, wherein said heat transfer element is in thermal conductive contact with said processor printed circuit board to draw heat generated by operation of said image processor of said vehicular camera module.

5. The vehicular camera module of claim 4, comprising a thermal interface material disposed between and in thermal conductive contact with (i) said processor printed circuit board and (ii) said heat transfer element.

6. The vehicular camera module of claim 1, wherein said vehicular camera module is configured to be disposed at the vehicle so as to view exterior of the vehicle.

7. The vehicular camera module of claim 1, wherein said heat transfer element is attached at structure of said camera housing.

8. The vehicular camera module of claim 7, wherein said heat transfer element is in thermal conductive contact with the active cooling element via the structure of said camera housing.

9. The vehicular camera module of claim 7, wherein said heat transfer element is attached at the structure of said camera housing via a plurality of fasteners.

10. The vehicular camera module of claim 7, further comprising a desiccant sheet disposed between (i) said heat transfer element and (ii) the structure of said camera housing.

11. The vehicular camera module of claim 10, comprising a heat spreading material disposed between (i) said desiccant sheet and (ii) the structure of said camera housing.

12. A vehicular camera module, said vehicular camera module comprising:

a camera housing;

an imager printed circuit board accommodated in said camera housing, said imager printed circuit board having a first side and a second side separated by a thickness dimension of said imager printed circuit board;

an imager disposed at the first side of said imager printed circuit board and aligned with a lens of said vehicular camera module;

a processor printed circuit board accommodated in said camera housing;

an image processor disposed at said processor printed circuit board;

wherein said processor printed circuit board is spaced from and is electrically connected to circuitry of said imager printed circuit board;

a heat transfer element accommodated in said camera housing;

wherein the heat transfer element is in thermal conductive contact with the second side of said imager printed circuit board, and wherein said heat transfer element extends through an aperture of said processor printed circuit board;

wherein said heat transfer element is in thermal conductive contact with an active cooling element;

wherein circuitry of said vehicular camera module is electrically connected to said imager and said image processor and is electrically connected to electrical connecting elements at said camera housing that are configured to electrically connect to a wire harness of a vehicle when said vehicular camera module is disposed at the vehicle;

wherein said vehicular camera module is configured to be disposed at the vehicle so as to view exterior of the vehicle; and wherein, with said electrical connecting elements electrically connected to the wire harness of the vehicle, heat generated by operation of said vehicular camera module is drawn from said imager printed circuit board to said camera housing via said heat transfer element.

13. The vehicular camera module of claim 12, comprising a thermal interface material disposed between and in thermal conductive contact with (i) the second side of said imager printed circuit board and (ii) said heat transfer element.

14. The vehicular camera module of claim 12, wherein said heat transfer element is attached at structure of said camera housing.

15. The vehicular camera module of claim 14, wherein said heat transfer element is in thermal conductive contact with the active cooling element via the structure of said camera housing.

16. The vehicular camera module of claim 14, wherein said heat transfer element is attached at the structure of said camera housing via a plurality of fasteners.

* * * * *